United States Patent [19]
Miyake et al.

[11] Patent Number: 5,848,119
[45] Date of Patent: *Dec. 8, 1998

[54] ILLUMINATION SYSTEM AND EXPOSURE APPARATUS HAVING THE SAME

[75] Inventors: Akira Miyake, Utsunomiya; Masami Hayashida, Yokohama, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 674,720

[22] Filed: Jul. 2, 1996

[30] Foreign Application Priority Data

Jul. 4, 1995 [JP] Japan ..................... 7-168707

[51] Int. Cl.⁶ ..................................... G21K 5/00
[52] U.S. Cl. ............................... 378/34; 378/43
[58] Field of Search ................... 378/34, 43, 84

[56] References Cited

U.S. PATENT DOCUMENTS 4,028,547  6/1977  Eisenberger ................ 378/34

FOREIGN PATENT DOCUMENTS 2-19850  1/1990  Japan .

*Primary Examiner*—Craig E. Church
*Attorney, Agent, or Firm*—Fitzpatrick, Cella, Harper & Scinto

[57] ABSTRACT

An illumination system includes a spectral optical element for separating radiation light from a radiation source, including at least one of X-rays and vacuum ultraviolet rays. The spectral optical element provides an emission angle to the radiation light which changes with the wavelength thereof. The system also includes an optical arrangement for illuminating an object with radiation light of a particular wavelength from the spectral optical element, and an absorption element for absorbing at least a portion of radiation light of a wavelength longer than the particular wavelength from the spectral optical element.

9 Claims, 6 Drawing Sheets

ILLUMINATION SYSTEM AND EXPOSURE APPARATUS HAVING THE SAME

FIELD OF THE INVENTION AND RELATED ART

This invention relates to an illumination system particularly suitably usable in an exposure apparatus or a microscope system which uses X-rays or vacuum ultraviolet rays.

In a lithographic process for optically transferring a fine structure pattern onto a resist, for manufacture of devices such as semiconductor devices, in order to meet further increase in density of and further miniaturization of a semiconductor device, exposure apparatuses using X-rays or vacuum ultraviolet rays that ensure higher resolution have attracted much attention. In such exposure apparatus, radiation light from a radiation source such as a synchrotron, an undulator or a laser plasma device, is projected on a reflection type or transmission type mask having a pattern formed thereon. The mask pattern is then projected by a projection optical system comprising plural reflection mirrors, onto a resist in a reduced scale. As for reflection type mask, it may be provided by patterning a reflection mirror with an absorptive material or anti-reflection film in accordance with the pattern to be transferred. As for the reflection mirror of the substrate of such reflection type mask or for a reflection mirror of the reduction projection optical system, mainly it may be provided by a multilayered film reflection mirror in which different materials are alternately accumulated and layered upon a substrate. For an illumination optical system for directing radiation light from a radiation source to a mask, it may be provided by an optical system using one or more reflection mirrors.

On the other hand, in conventional X-ray microscope systems, X-rays from a radiation source such as a synchrotron or laser plasma device are projected to a sample to be observed, and X-rays passing through the sample are imaged by reflection mirrors, in an enlarge scale, upon a detector whereby it is detected. The detector may comprise a photographic film or a two-dimensional image detector such as CCD or MCP. As a reflection mirror, a multilayered film provided by alternately accumulating different materials or provided by a total reflection mirror for grazing projection, may be used. As for an illumination optical system for directing X-rays from a radiation source to a sample to be observed, an optical system having one or more reflection mirrors may be used.

Radiation light from a synchrotron, an undulator or a laser plasma device includes not only X-rays or vacuum ultraviolet rays, necessary for pattern transfer or sample observation, but also ultraviolet light of longer wavelength or light of wavelength in visible region.

Multilayered film usable for a reflection type mask or a reflection mirror of an X-ray imaging optical system, may generally be provided by alternately accumulating metal and light metal (e.g., molybdenum and silicone). For X-rays, such multilayered film may effective to reflect only those X-rays of particular wavelength (e.g., 13 nm) in a narrow bandwidth, due to interference effect. However, it reflects ultraviolet rays of wavelengths longer than a few tens nanometers and, in visible region, it reflects light rays of almost all wavelengths.

The amount d of diffraction blur of a reduction optical system, the numerical aperture of the optical system is NA and the wavelength is $\lambda$, is given by:

$$d = 0.61 \times \lambda / NA$$

Thus, the diffraction blur is proportional to the wavelength. If for example NA is 0.2, there occurs diffraction blur of about 40 nm for X-rays of a wavelength 13 nm and of about 600 nm for ultraviolet rays of a wavelength 200 nm. Thus, when the exposure process is performed by using light of longer wavelength, resolution necessary for pattern transfer would not be attainable. When a pattern of 100 nm is to be transferred, a good resist pattern would be obtainable if the exposure process is performed only by X-rays of a wavelength 13 nm. However, if it is performed by using ultraviolet rays of a wavelength 200 nm, the contrast decreases due to diffraction blur such that a good pattern is not obtainable.

As described above, including unwanted light of longer wavelengths with X-rays or vacuum ultraviolet rays with which the exposure process is inherently to be performed, causes disadvantages that in an exposure apparatus such unwanted light is directed to a reflection type mask, an imaging optical system and a wafer to bring about sensitization of a resist, whereby pattern transfer precision is deteriorated. Also, in a microscope system, unwanted light is directed to a detector to cause deterioration of image detection.

Japanese Laid-Open Patent Application, Laid-Open No. 19850/1990, proposes a lithographic process as a solution for that problem. In this method, a layer of carbon or aluminum is provided on the surface of a resist, by which light of longer wavelengths is reflected or absorbed. Alternatively, a carbon layer is provided on the surface of a mirror, by which light of longer wavelengths is absorbed. This is to prevent sensitization of the resist by the light of longer wavelengths.

However, with such method by which a reflective or absorptive layer is provided on the surface of a resist, it is necessary that such a layer is formed prior to the exposure process and also that it is removed after the exposure process. This significantly decreases the device productivity. With the method by which an absorptive layer is provided on the surface of a mirror, it is not possible to completely absorb light of all wavelengths unnecessary for the pattern transfer process and, thus, it is not possible to sufficiently suppress deterioration of resolution due to light of longer wavelengths. It is therefore necessary to use that method in combination with the method of providing a reflective or absorptive layer on the surface of the resist. This necessarily results in decreased device productivity

SUMMARY OF THE INVENTION

It is accordingly an object of the present invention to provide an illumination system by which unwanted light can be avoided effectively with a simple structure.

It is another object of the present invention to provide a high precision exposure apparatus and/or microscope system using such illumination system.

It is a further object of the present invention to provide a device manufacturing method which uses an illumination system or exposure apparatus such as above.

Briefly, the problem described above can be solved by the present invention, as follows:

As a constituent element of an optical system for directing radiation light from a radiation source, such as X-rays or vacuum ultraviolet rays, to an article to be illuminated, a spectroscopic element in which angle of emission of radiation ray differs with the wavelength may be used. Such a spectroscopic element may comprise an asymmetrically cut monocrystal or a diffraction grating.

If X-rays are projected on a monocrystal and if the wavelength of the X-rays is λ, the angle of incidence to the crystal lattice is θ, and the interplaner spacing of the crystal lattice is d, then the X-ray reflection occurs when the Bragg's condition as follows is satisfied:

$$2 \times d \times \cos\theta = m \times \lambda$$

where m is a natural number representing diffraction order. In an asymmetrically cut crystal, the geometrical surface and the crystal lattice plane are inclined and, therefore, if seen from the crystal surface, the incidence angle and emission angle of X-rays are different. As compared therewith, if ultraviolet rays or visible light is projected upon an asymmetrically cut monocrystal, since ordinary mirror surface reflection (total reflection) occurs at the geometrical surface of the crystal, the incidence angle and the reflection angle of light as seen from the crystal surface are equal to each other (see FIG. 4).

If X-rays are projected on a diffraction grating, there occurs diffraction in relation to the wavelength and incidence angle that satisfy the diffraction condition with respect to the grating spacing. If the wavelength of X-rays is λ, the spacing of grid lines of the diffraction grating is p, the incidence angle is α, and the emission angle is β, then diffraction of X-rays occurs when the diffraction condition as follows is satisfied:

$$(\sin\alpha - \sin\beta) \times p = m \times \lambda$$

where m is an integer representing diffraction order. If the diffraction order m is not equal to zero, the incidence angle and emission angle of X-rays, as viewed toward the surface of the diffraction grating, are different from each other. Additionally, the emission angle changes with the wavelength. If on the other hand the diffraction order m is equal to zero, as in the case of ordinary mirror surface reflection, the incidence angle and the emission angle as viewed from the diffraction grating surface are equal to each other (see FIG. 5).

Using a spectroscopic element such as described above makes it possible to reflect unwanted light from the ultraviolet or regions visible region, emitted from a radiation source such as a synchrotron, a laser plasma device, or an undulator, for example, in a direction different from that of X-rays or vacuum ultraviolet rays necessary for pattern transfer in an exposure apparatus or for image observation in a microscope system, to thereby separate the former from the latter. The thus separated unwanted light of longer wavelengths may preferably be absorbed by a suitable radiation absorbing means.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

First Embodiment

Figure 1:
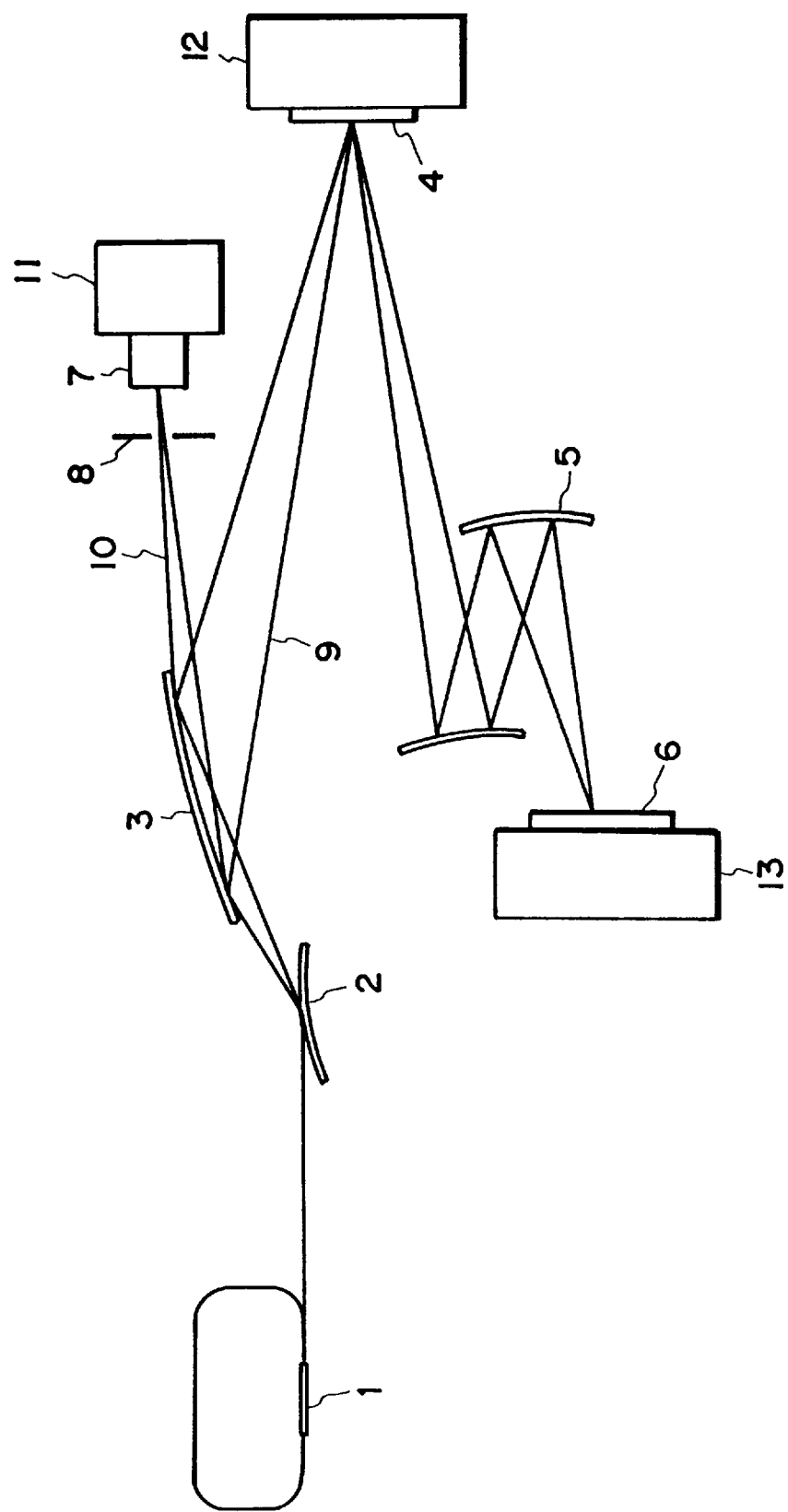
FIG. 1 is a schematic view of an illumination system according to a first embodiment of the present invention.

FIG. 1 is a schematic view of a first embodiment of the present invention which is applied to a reduction projection exposure apparatus for manufacture of semiconductor devices, which uses X-rays. While this embodiment uses X-rays as the radiation for the exposure process, vacuum ultraviolet rays may be used in a similar way.

Denoted in FIG. 1 at 1 is an undulator radiation source for producing X-rays. Denoted at 2 is a convex surface total reflection mirror, and denoted at 3 is a concave surface diffraction grating. These are components of an illumination optical system. Denoted at 4 is a reflection type mask having a pattern to be transferred, and denoted at 5 is an imaging optical system having plural multilayered reflection mirrors. Denoted at 6 is a wafer which is coated with a resist, and denoted at 7 is an absorptive material. Denoted at 8 is an aperture member which serves as means for absorbing and intercepting light of unwanted wavelengths. Denoted at 12 is a mask stage on which the mask 4 is placed, and denoted at 13 is a wafer stage on which the wafer 6 is placed. Denoted at 9 is a monochromatic X-ray beam, and denoted at 10 is light of longer wavelengths.

Radiation from the undulator radiation source 1 includes not only X-rays of basic wave but also harmonic X-rays and ultraviolet rays or continuous X-rays from a deflection electromagnet unit. Also, the light emitted by the radiation source 1 comprises a narrow beam of pencil shape. This beam is reflected and expanded by the metal total reflection mirror 2 of a shape of a convex revolutional ellipsoid, and then it is reflected by the diffraction grating 3 of a shape of a concave revolutional ellipsoid. The surface of the diffraction grating 3 is provided by platinum. The grating line spacing of the diffraction grating 3 is 1 micron, and the blaze angle is 3.75 deg. Light from the metal total reflection mirror 2 is incident on the diffraction grating 3 with an angle 88 deg. If X-rays of a wavelength 13 nm are projected thereon, first-order diffraction light is emitted in the direction of 80.5 deg. The blaze angle of 3.75 deg. is so set as to provide higher efficiency of first-order diffraction and to suppress diffraction light of other diffraction orders. For example, if ultraviolet rays of a wavelength 200 nm are projected thereon, first-order diffraction light is emitted in the direction of 53.1 deg. However, it deviates largely from the blaze condition and, therefore, the efficiency of first-order diffraction is small and most light is collected to zero-th order light which emits with an angle 88 deg. On the other hand, light of a wavelength shorter than 13 nm is diffracted in the direction of an emission angle larger than 80.5 deg. Since however, for X-rays of shorter wavelengths, the reflectivity of platinum becomes lower, most light is absorbed by the diffraction grating. Finally, only X-rays of a wavelength 13 nm is concentrated into the direction of 80.5 deg, and most light of the other wavelengths is emitted with an angle 88 deg., or it is absorbed by the diffraction grating 3.

Radiation absorptive member 7 made of aluminum is disposed in the direction of 88 deg. Thus, after passing the aperture member 8, the light is absorbed by the absorptive member. The absorptive member 7 is equipped with a cooling device 11 for suppressing temperature rise. Only a small portion of the light projected on the aluminum of the absorptive member 7 is scatted by the surface thereof but, since it is blocked by the aperture member, it does not reach the mask or the imaging optical system. Thus, degradation of resolution is prevented.

In accordance with the present embodiment, as described above, a diffraction grating is used in an illumination optical system of a reduction projection exposure apparatus, by which ultraviolet rays of longer wavelengths or light of visible region from an undulator radiation source, are reflected in a direction different from that of X-rays necessary for the exposure process and thus they are separated from those X-rays. As a result, degradation of resolution of pattern transfer is prevented.

Second Embodiment

Figure 2:
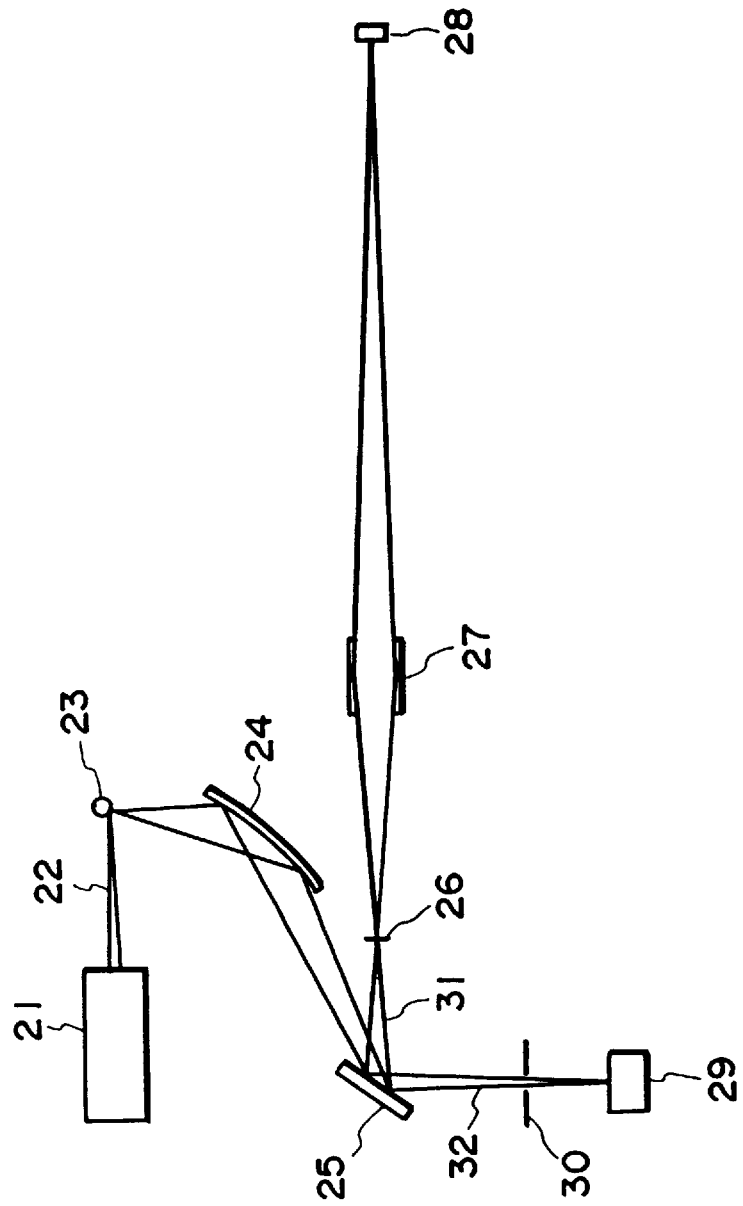
FIG. 2 is a schematic view of an illumination system according to a second embodiment of the present invention.

FIG. 2 is a schematic view of a second embodiment of the present invention which is applied to an X-ray microscope for enlarged observation of a biological sample. While this embodiment uses X-rays as a radiation for image observation, vacuum ultraviolet rays may be used in a similar manner.

Denoted in FIG. 2 at 21 is a glass laser, and denoted at 22 is visible light. Denoted at 23 is a laser target, which is a component of a laser plasma X-ray radiation source. Denoted at 24 is a convex surface total reflection metal collecting mirror, and denoted at 25 is an asymmetrically cut Bragg crystal. Denoted at 26 is a sample to be observed, and denoted at 27 is a Walter-type imaging optical system using a multilayered reflection mirror. Denoted at 28 is a two-dimensional X-ray detector which comprises a CCD. Denoted at 29 is an absorptive member, and denoted at 30 is an aperture member. These elements provide blocking means for absorbing and intercepting unwanted light of longer wavelengths. Denoted at 22 is visible light, denoted at 31 is a monochromatic X-ray beam, and denoted at 32 is light of longer wavelengths.

Double harmonic wave (wavelength 530 nm) of the glass laser 21 is projected on the target 23 of titanium to generate plasma, by which X-rays are produced. The X-rays produced by this comprises continuous spectrum including a number of bright lines. These X-rays are collected by the total reflection metal mirror 24 of a shape of a convex revolutional ellipsoid, and are directed to the asymmetrically cut Bragg crystal 25.

The crystal 25 may comprise a KAP monocrystal. It has a reflection surface polished with inclination of 45 deg. with respect to the crystal lattice plane. If X-rays are projected on this reflection surface with an angle 65 deg., they are incident on the crystal lattice plane with an angle of 20 deg. Since the grating line spacing of KAP is 1.332 nm, the first-order Bragg's condition for X-rays incident thereto at a 20 deg. angle is:

$$2 \times 1.332 \times \cos 20° = \lambda$$

Thus, first-order diffraction occurs to X-rays of a wavelength 2.50 nm, and the reflection light 31 is emitted with an angle of 20 deg. to the crystal surface.

The sample 26 and the enlarging optical system 27 are set with this angle, relative to the crystal 25. Thus, the sample 26 is illuminated with monochromatic X-rays of a wavelength 2.50 nm. The monochromatic X-rays of wavelength 2.50 nm, passing through the sample 26, are directed to the enlarging projection optical system 27 of Walter type, and an enlarged image is formed on the CCD 28.

On the other hand, as regards those rays, of the light incident on the Bragg crystal 25, that have longer wavelengths not satisfying the diffraction condition, most of them are mirror-surface reflected and emit in the direction of 65 deg. Most of light (X-rays) of shorter wavelengths not satisfying the diffraction condition is absorbed by the crystal 25. The mirror-surface reflected light 32 goes through the aperture member 30, and it is projected on the absorptive member 29, made of copper, whereby it is absorbed. While only a small portion of the light projected on the copper absorptive member 39 is scattered by the surface of the copper, it is then blocked by the aperture member 30. As a result, it does not reach the sample 26 or the imaging optical system 27, and degradation of resolution is prevented.

Figure 3:
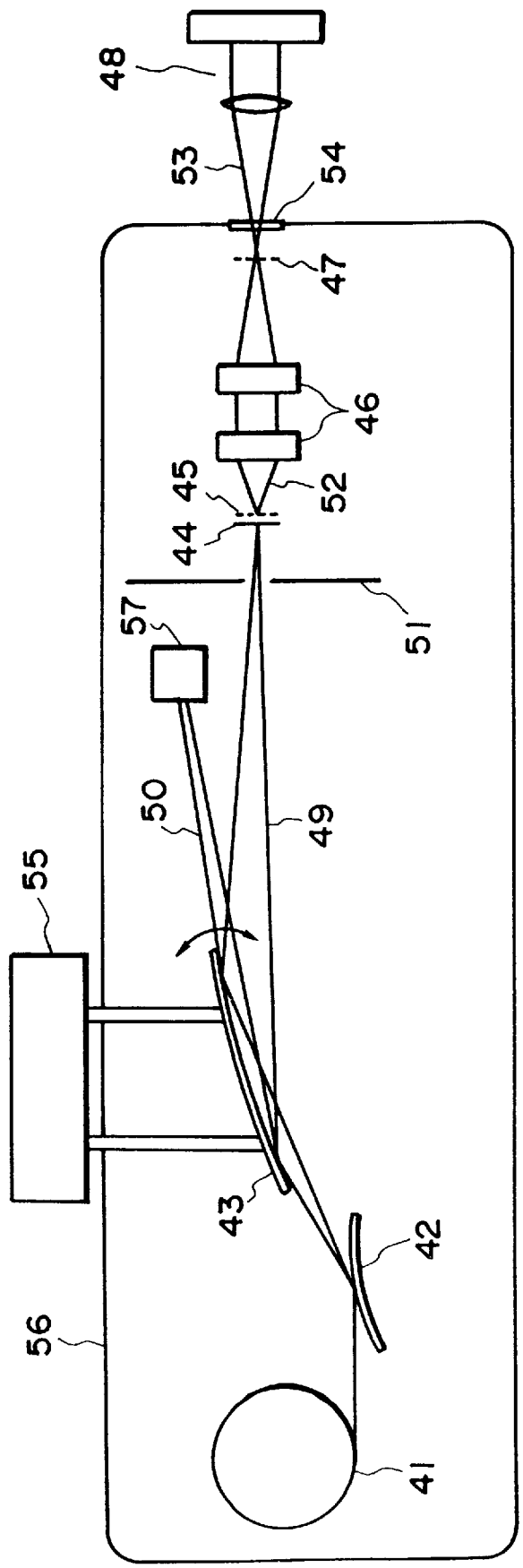
FIG. 3 is a schematic view of an illumination system according to a third embodiment of the present invention.
Figure 4:
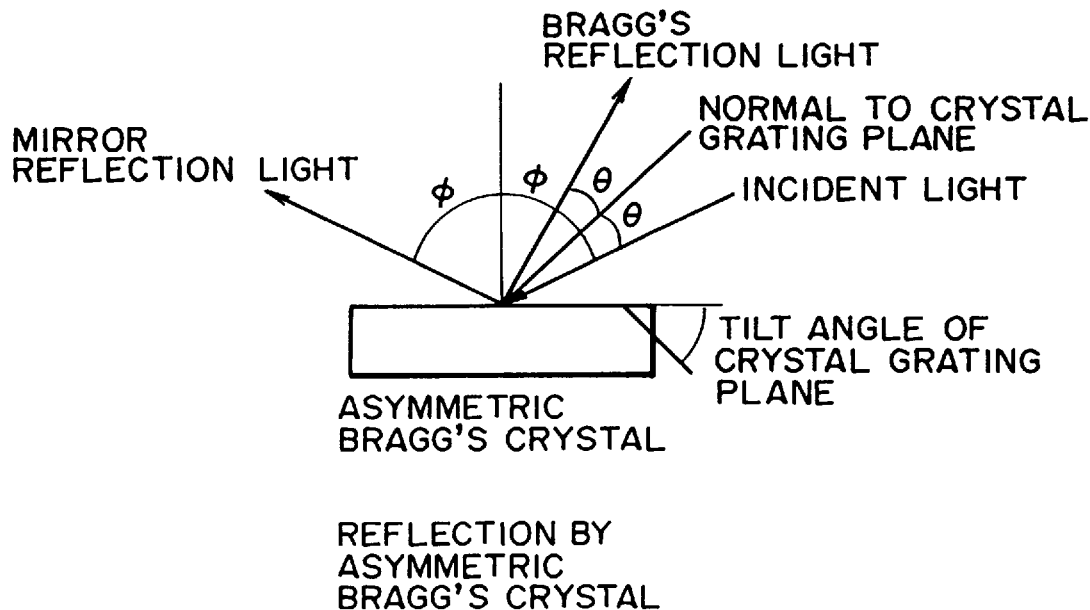
FIG. 4 is a schematic view for explaining the principle of reflection by an asymmetric Bragg's crystal.
Figure 5:
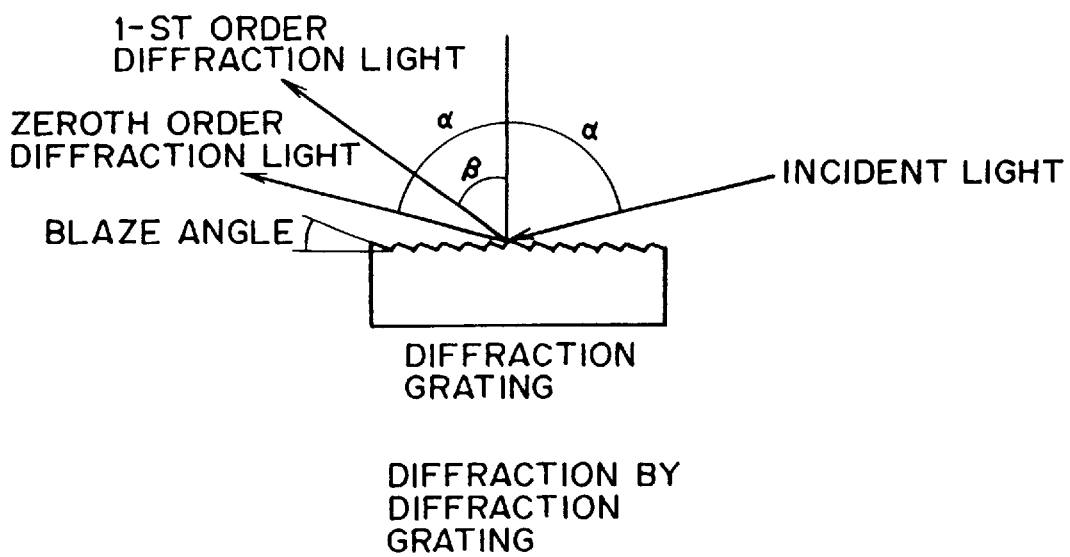
FIG. 5 is a schematic view for explaining the principle of diffraction by a diffraction grating.

In accordance with this embodiment of the present invention, as described above, an asymmetrically cut Bragg crystal is used in an illumination optical system of an X-ray microscope, by which ultraviolet rays of longer wavelengths or light from the visible region from a radiation source such as a laser plasma device, are reflected in a direction different from that of X-rays necessary for the image observation, and they are separated from those X-rays. As a result, degradation of resolution of detected image or decrease of contrast thereof is prevented Third Embodiment FIG. 3 is a schematic view of a third embodiment of the present invention which is applied to an X-ray microscope for enlarged observation of a biological sample. While this embodiment uses X-rays as a radiation type for image observation, vacuum ultraviolet rays may be used in a similar way.

Denoted in FIG. 3 at 41 is a synchrotron radiation source, and denoted at 42 is a total reflection metal collecting mirror. Denoted at 44 is a thin-sheet like sample to be observed, and denoted at 45 is a photoelectric conversion surface. Denoted at 46 is an electron optical system for expanding and imaging an electron beam. Denoted at 47 is a fluorescent surface, and denoted at 48 is a visible light image pickup device (image pickup camera). Denoted at 51 is an aperture member, and denoted at 55 is a mechanism for changing the angle of a diffraction grating 43, and denoted at 56 is a vacuum container. Denoted at 57 is an absorptive member. Denoted at 49 is monochromatic X-ray radiation, denoted at 50 is light of longer wavelengths, and denoted at 53 is visible light.

Light which is emitted by a deflection electromagnet radiation source of the synchrotron radiation source 41 comprises a continuous spectrum including X-rays, ultraviolet rays, and visible light, for example. It is emitted in a sheet-beam shape. This beam is reflected and expanded by the metal total reflection mirror 42 of a shape of a convex revolutional ellipsoid, and then it is reflected by the diffraction grating 43 of a shape of a concave revolutional ellipsoid. The surface of the diffraction grating 43 is coated with gold. The grating line spacing is 0.8 micron, and the blaze angle is 1.4 deg. Reflected light from the metal total reflection mirror 42 is projected on the diffraction grating 43 with an angle of 87 deg. thereto. If X-rays of a wavelength 3.1 nm are incident on the diffraction grating 43, first-order diffraction light emits in the direction of 84.13 deg. Thus, this diffraction light advances along a direction deflected by 8.87 deg. relative to the incident light. The aperture of the aperture member 51 is disposed in this direction, such that light passing through the aperture is projected on the sample 44. The X-rays passing through the sample 44 are projected on the photoelectric surface 45 which is disposed in intimate contact with the sample, whereby the transmitted X-ray image is converted into a photoelectron image. This photoelectron image is then enlarged by the electron lens 46 and is imaged upon the fluorescent surface 47, by which it is converted into a visible light image which is in turn recorded by the image pickup camera 48.

Since X-rays of wavelengths other than 3.1 nm are intercepted by the aperture member 51, such that they are not projected on the sample 44. Also, most of visible light or ultraviolet rays, corresponding to light 50 of longer wavelengths, is mirror-surface reflected by the surface of the diffraction grating 43. Radiation absorptive member 57 made of graphite is disposed in the direction of mirror surface reflection, such that unwanted radiation is absorbed thereby. While only a small portion of the light projected on the graphite of the absorptive member 57 is scattered, it is blocked by the aperture member 51. Thus, it does not reach the sample 44. As a result, degradation of resolution is prevented. In the manner described above, an image of monochromatic X-rays passed through the sample is converted into a visible light image which is then enlarged and observed.

The present embodiment is equipped with a driving mechanism 55 for moving the diffraction grating 43, by which it is possible to change the X-ray incidence angle minutely about 87 deg. to thereby change the wavelength of X-rays to be projected on the sample 44. The wavelength of X-rays passing through the aperture, which is in a direction deflected by 8.87 deg. with respect to the incident light, and projected on the sample 44, is 3.0 nm when the incidence angle is 86.95 deg. It is 3.2 nm when the incidence angle is 87.05 deg. Since the K absorption edge wavelength of nitrogen is 3.1 nm, the wavelength of X-rays projected to the sample 44 changes across this absorption edge. By comparing two or more images observed by changing the wavelength in this manner, it is possible to identify nitrogen element distribution of the sample.

In accordance with this embodiment of the present invention as described above, a diffraction grating is used in an illumination optical system of an X-ray microscope, by which ultraviolet rays of longer wavelengths or visible light emitted from a synchrotron radiation source is reflected in a direction different from that of X-rays necessary for image observation. Thus, it is separated from those X-rays. As a result, degradation of resolution or contrast is prevented. Additionally, the incidence angle of light upon the diffraction grating may be changed to change the wavelength of X-rays impinging on the sample. This makes it possible to obtain information about element distribution of the sample, for example.

Fourth Embodiment

Next, an embodiment of device manufacturing method which uses an exposure apparatus according to any of the embodiments described hereinbefore, will be explained.

Figure 6:
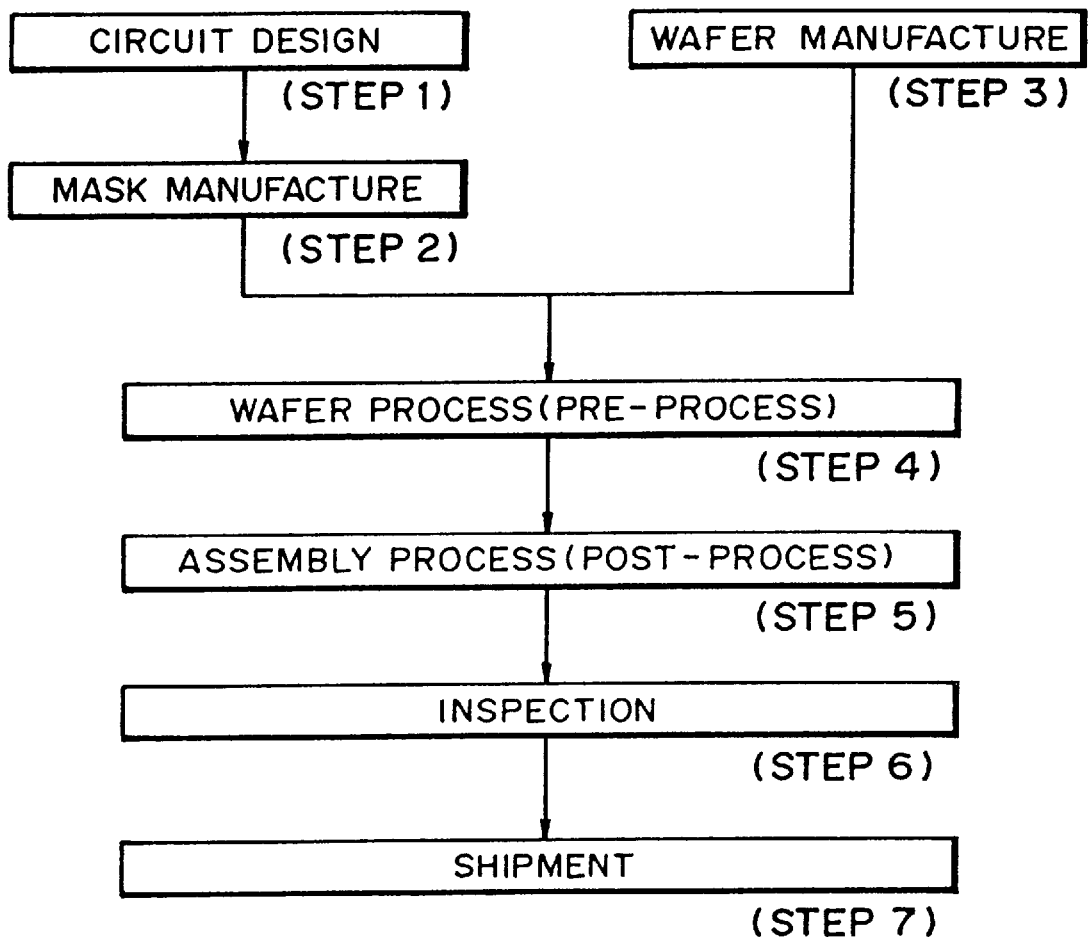
FIG. 6 is a flow chart for explaining device manufacturing processes.

FIG. 6 is a flow chart of the sequence of manufacturing a microdevice such as a semiconductor chip (e.g. IC or LSI), a liquid crystal panel, a CCD, a thin film magnetic head, or a micro-machine, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check, and so on, of the semiconductor devices produced by step 5 are carried out. With these processes, semiconductor devices are finished and they are shipped (step 7).

Figure 7:
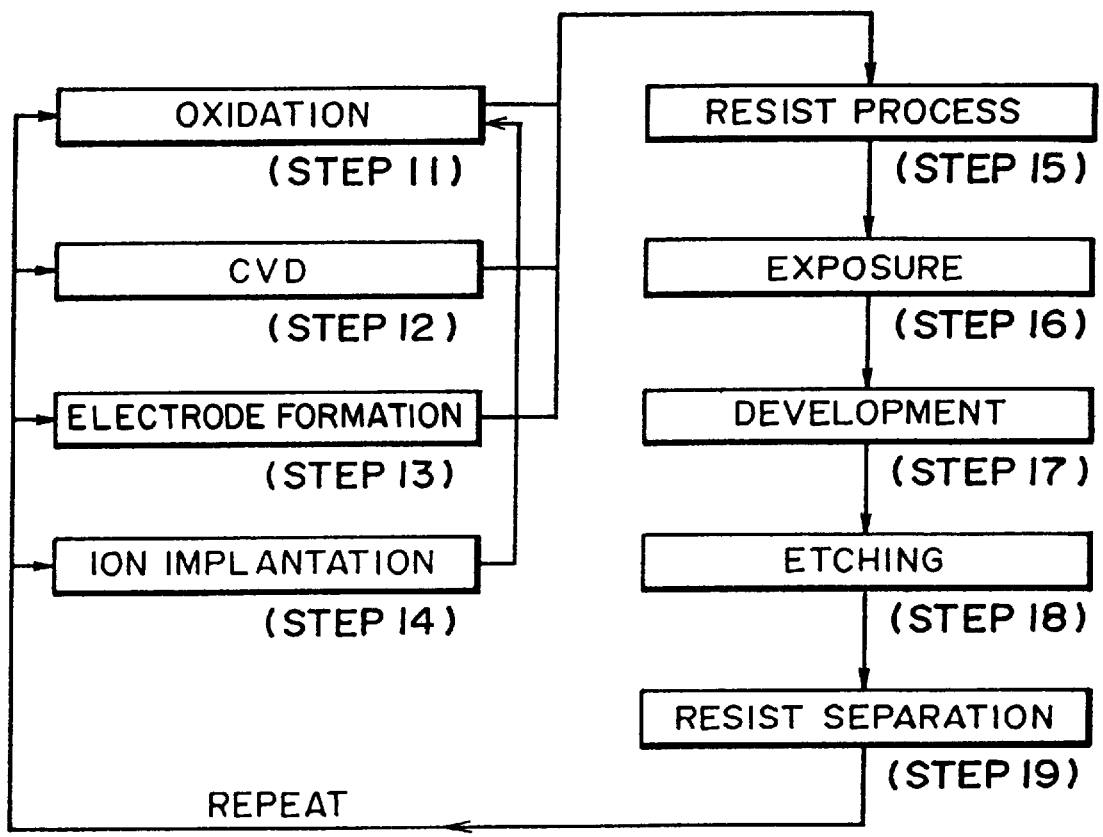
FIG. 7 is a flow chart for explaining details of a wafer process.

FIG. 7 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:
    a spectral optical element for separating radiation light from a radiation source, the radiation light including at least one of X-rays and vacuum ultraviolet rays, said spectral optical element being operable to impart an emission angle to the radiation light which is changeable with its wavelength;
    means for illuminating an object with radiation light of a particular wavelength from said spectral optical element;
    an absorptive member for absorbing at least a portion of radiation light of a wavelength longer than the particular wavelength, from said spectral optical element; and
    an aperture member for blocking any scattered light being scattered by a surface of said absorptive member, to prevent the scattered light from impinging on the object.

2. An illumination system according to claim 1, wherein said absorbing means absorbs at least one of ultraviolet rays and visible light.

3. An illumination system according to claim 1, said optical element comprising an asymmetrically cut Bragg reflection crystal.

4. An illumination system according to claim 1, said optical element comprising a diffraction grating.

5. An illumination system according to claim 4, further comprising a driving mechanism for changing the angle of said diffraction grating with respect to the radiation light.

6. An illumination system according to claim 1, said radiation source comprising one of an undulator radiation source, a laser plasma radiation source, and a synchrotron radiation source.

7. An exposure apparatus for exposing a substrate, having an illumination system for illuminating the substrate, said illumination system comprising:

a spectral optical element for separating radiation light from a radiation source, the radiation light including at least one of X-rays and vacuum ultraviolet rays, said spectral optical element being operable to impart an emission angle to the radiation light which is changeable with its wavelength;

means for illuminating an object with radiation light of a particular wavelength from said spectral optical element;

an absorptive member for absorbing at least a portion of radiation light of a wavelength longer than the particular wavelength, from said spectral optical element; and an aperture member for blocking any scattered light being scattered by a surface of said absorptive member, to prevent the scattered light from impinging on the object.

8. A microscope for enlarged observation of a sample, having an illumination system for illuminating the sample, said illumination system comprising:

a spectral optical element for separating radiation light from a radiation source, the radiation light including at least one of X-rays and vacuum ultraviolet rays, said spectral optical element being operable to impart an emission angle to the radiation light which is changeable with its wavelength;

means for illuminating an object with radiation light of a particular wavelength from said spectral optical element;

an absorptive member for absorbing at least a portion of radiation light of a wavelength longer than the particular wavelength, from said spectral optical element; and an aperture member for blocking any scattered light being scattered by a surface of said absorptive member, to prevent the scattered light from impinging on the object.

9. A device manufacturing method comprising the steps of:

providing an exposure apparatus for exposing a substrate having an illumination system for illuminating the substrate, said illumination system comprising:

a spectral optical element for separating radiation light from a radiation source, the radiation light including at least one of X-rays and vacuum ultraviolet rays, said spectral optical element being operable to impart an emission angle to the radiation light which is changeable with its wavelength;

means for illuminating an object with radiation light of a particular wavelength from said spectral optical element;

an absorptive member for absorbing at least a portion of radiation light of a wavelength longer than the particular wavelength, from said spectral optical element;

manufacturing a device by using the exposure apparatus provided in said providing step; and an aperture member for blocking any scattered light being scattered by a surface of said absorptive member, to prevent the scattered light from impinging on the object.

* * * * *

UNITED STATES PATENT AND TRADEMARK OFFICE
CERTIFICATE OF CORRECTION

PATENT NO. : 5,848,119

DATED : December 8, 1998

INVENTOR(S) : Miyake et al.

It is certified that error appears in the above-identified patent and that said Letters Patent is hereby corrected as shown below:

COLUMN 1:

Line 37, "enlarge" should read --enlarged--;
Line 56, "may" should read --may be--;
Line 59, "tens" should read --tens of--; and
Line 64, "system," should read --system, if--.

COLUMN 3:

Line 3, "interplaner" should read --interplanar--; and
Line 43, "or regions visible region," should read
 --or visible regions,--.

UNITED STATES PATENT AND TRADEMARK OFFICE
CERTIFICATE OF CORRECTION

PATENT NO. : 5,848,119

DATED : December 8, 1998

INVENTOR(S) : Miyake et al.

It is certified that error appears in the above-identified patent and that said Letters Patent is hereby corrected as shown below:

COLUMN 4:

Line 62, "is" should read --are--.

COLUMN 5:

Line 44, "comprises" should read --comprise a--.

COLUMN 6:

Line 27, "prevented" should read --prevented.--.

COLUMN 7:

Line 11, "such that" should be deleted.

Signed and Sealed this

Sixth Day of July, 1999

Q. TODD DICKINSON

*Attest:*

*Attesting Officer*     Acting Commissioner of Patents and Trademarks